US012808824B2

(12) United States Patent
Masters et al.

(10) Patent No.: US 12,808,824 B2
(45) Date of Patent: Nov. 24, 2026

(54) CAMERA FOR ELECTRON DIFFRACTION PATTERN ANALYSIS

(71) Applicant: Oxford Instruments Nanotechnology Tools Limited, High Wycombe (GB)

(72) Inventors: Robert Masters, Oxen (GB); Angus Bewick, Oxfordshire (GB); Peter Statham, Oxen (GB)

(73) Assignee: Oxford Instruments Nanotechnology Tools Limited, High Wycombe (GB)

( * ) Notice: Subject to any disclaimer, the term of this patent is extended or adjusted under 35 U.S.C. 154(b) by 557 days.

(21) Appl. No.: 17/923,867

(22) PCT Filed: May 5, 2021

(86) PCT No.: PCT/GB2021/051091

§ 371 (c)(1),
(2) Date: Nov. 7, 2022

(87) PCT Pub. No.: WO2021/224622

PCT Pub. Date: Nov. 11, 2021

(65) Prior Publication Data

US 2023/0175991 A1 Jun. 8, 2023

(30) Foreign Application Priority Data

May 5, 2020 (GB) ..................................... 2006638

(51) Int. Cl.
*G01N 23/2055* (2018.01)
*G01N 23/20058* (2018.01)
(Continued)

(52) U.S. Cl.
CPC ... *G01N 23/2055* (2013.01); *G01N 23/20058* (2013.01); *G01N 23/203* (2013.01);
(Continued)

(58) Field of Classification Search
None
See application file for complete search history.

(56) References Cited

U.S. PATENT DOCUMENTS 8,378,310 B2 2/2013 Bornefalk et al.
8,890,065 B2 11/2014 Statham et al.
(Continued)

FOREIGN PATENT DOCUMENTS

CN 102834736 A 12/2012
JP H09-147781 A 6/1997
(Continued)

OTHER PUBLICATIONS

Japanese Office Action with English translation received in corresponding Japanese patent application No. 2022-567272, mail date Nov. 5, 2024.

(Continued)

*Primary Examiner* — Eliza W Osenbaugh-Stewart
(74) *Attorney, Agent, or Firm* — BLANK ROME LLP

(57) ABSTRACT

An apparatus for detecting Kikuchi diffraction patterns is provided. The apparatus comprises: an electron column adapted in use to provide an electron beam directed towards a sample, the electron beam having an energy in the range 2 keV to 50 keV, and; an imaging detector for receiving and counting electrons from the sample due to interaction of the electron beam with the sample, the detector comprising an array of pixels and having a count rate capability of at least 2,000 electrons per second for each pixel, wherein: the imaging detector is adapted to provide electronic energy filtering of the received electrons in order to count the received electrons which are representative of the said diffraction pattern, and the particle detector has an inert layer on the surface where the electrons enter towards the active region of the detector, wherein the inert layer disperses the detected energy of 20 keV incident electrons with an energy (Continued)

spread having a full-width half maximum less than 3.2 keV. A method for detecting Kikuchi diffraction patterns is also provided.

15 Claims, 7 Drawing Sheets

(51) Int. Cl.

| | |
|---|---|
| ***G01N 23/203*** | (2006.01) |
| ***H01J 37/22*** | (2006.01) |
| ***H01J 37/26*** | (2006.01) |
| ***H01J 37/28*** | (2006.01) |

(52) U.S. Cl.

CPC ......... *H01J 37/28* (2013.01); *H01J 2237/244* (2013.01); *H01J 2237/24495* (2013.01)

(56) References Cited

U.S. PATENT DOCUMENTS

2014/0252226 A1 9/2014 Statham et al.
2018/0224564 A1* 8/2018 Fu ........................... G01T 1/247

FOREIGN PATENT DOCUMENTS

JP H10186041 A 7/1998
JP 2012026827 A 2/2012

OTHER PUBLICATIONS

International Search Report and Written Opinion from PCT/GB2021/051091 dated Sep. 22, 2021.

Mikheev et al., "Energy Loss Spectra for a Fast Charged Particle Beam Transmitted through a Material Film of Specified Thickness," *Journal of Surface Investigation X-ray Synchrotron and Neutron Techniques* • Apr. 2009, pp. 218-222.

Segal et al., "Thin-Entrance Window Sensors for Soft X-rays at LCLS-II," *2018 IEEE*, 978-1-5386-8494-8/18.

Shandiz et al., "Detailed Monte Carlo Simulation of Electron Transport and Electron Energy Loss Spectra," Scanning vol. 38, 475-491 (2016).

Vespucci et al., "Digital direct electron imaging of energy-filtered electron backscatter diffraction patterns," *Physical Review* B 92, 205301 (2015).

Ballabriga et al., "Characterization of the Medipix3 pixel readout chip," Published By IOP Publishing for SISSA, 12th International Workshop on Radiation Imaging Detectors, Jul. 11-15, 2010, XP020203508A.

Wall et al., "Nuclear Instruments and Methods in Physics Research A," Nuclear Instruments and Methods Physics Research, A 744 (2014) 73-79 (XP028636620A).

Wilkinson et al., "Direct Detection of Electron Backscatter Diffraction Patterns," PRL 111, 065506 (2013) week ending Aug. 9, 2013; XP055838700A.

Mir et al., "Characterisation of the Medipix3 detector for 60 and 80 keV electrons," *Ultramicroscopy*, 182 (2017) 44-53 (XP085204019A).

Chinese Office Action mail date Jul. 22, 2025.

* cited by examiner

CAMERA FOR ELECTRON DIFFRACTION PATTERN ANALYSIS

CROSS REFERENCE TO RELATED APPLICATIONS

This application is a national stage of International Application No. PCT/GB2021/051091, filed May 5, 2021, which claims priority to GB 2006638.7, filed May 5, 2020, each of which are incorporated herein by reference in their entirety.

FIELD OF THE INVENTION

The invention relates to an apparatus and method for performing microdiffraction analysis on a specimen, in particular Electron Backscatter Diffraction (EBSD) analysis, in order to detect Kikuchi diffraction patterns.

BACKGROUND TO THE INVENTION

In microdiffraction analysis, an electron beam is directed towards a crystalline specimen and the interaction of the electrons in the electron beam with the specimen causes different types of particle to be produced. Electrons originating from the source electron beam that are elastically backscattered from the specimen and then diffracted by the lattice planes of the crystal are of particular interest in the study of materials. These electrons, which have an energy close to that of the primary beam, form the basis for Electron Back Scatter Diffraction (EBSD) analysis. For EBSD analysis, diffraction contrast is captured as an image (a diffraction pattern) by a pixelated detector, this pattern being used to measure properties of the specimen, for example crystal orientation and strain. A Scanning Electron Microscope (SEM) is typically used to generate the primary electron beam and to mount the specimen and detector.

A particle-counting pixel array may be used as the imaging detector for microdiffraction analysis, as described in U.S. Pat. No. 8,890,065. In such a system, the magnitude of the signal generated by an individual particle received at the detector is compared with a threshold to discriminate the signal from system noise so that individual particles can be counted. Furthermore, since the signal level is governed by the energy of the incident particle, this threshold can be used to discriminate between particles of different energies, counting only those particles whose energies are greater than a configurable threshold or to lie in a band between two thresholds. Such particle-counting pixel arrays were originally developed for use in high-energy physics experiments or as X-ray detectors (where they are sometimes known as hybrid photon counting detectors, or HPC detectors) but have now been adopted for use in EBSD.

In EBSD, the "signal" of interest is the diffraction contrast in EBSD patterns and this is carried mainly by electrons whose energies lie within a narrow energy band between the SEM's primary beam energy $E_0$ ($E_0$ may typically be 20 keV), and typically 1-2 keV below $E_0$. Electrons whose energies lie below this band do not contribute diffraction contrast but just contribute a background to the measurement that reduces the precision in measuring diffraction contrast. The relative fraction of backscattered electrons carrying diffraction contrast is increased if the electron beam is incident on the specimen at a small angle relative to the sample surface plane; for this reason conventional EBSD experiments are performed with the specimen tilted by an angle enabling this incident geometry.

In order to identify the type of crystal and orientation responsible for the characteristic Kikuchi diffraction contrast, the EBSD pattern is processed to detect lines in the image and associate them with planes in a crystal. Typically, this is achieved using a Hough transform approach. Once lines and angular relationships have been measured, the results are used to find a close match to a type of crystal. If not enough lines are detected or a sufficiently close match to a crystal type cannot be found, then the pattern cannot be indexed. If the pattern can be indexed, the orientation of the crystal can be determined. If patterns are obtained on a grid of points covering the field of view, a map showing crystal orientation at every point in the field of view can be obtained. If there are a significant fraction of patterns that cannot be indexed, the orientation map is not useful. In this case, the SEM electron beam current or the acquisition time for an individual pattern must be increased in order to get an acceptable fraction of successfully indexed patterns. There are limits to how much beam current can be produced in SEMs and specimens may be damaged with too high a beam current. If the acquisition time per pixel is increased, the time to acquire an orientation map will be longer. Therefore, it is desirable to achieve a high percentage of successfully indexed patterns with the lowest beam current and shortest acquisition time.

The percentage of successfully indexed patterns at a given beam current and acquisition time is partly dependent on the specimen and various experimental conditions. However, for a particular specimen and fixed experimental conditions, a "sensitivity" measure describes the ability of the detection equipment to acquire patterns that can be successfully indexed using short acquisition times and low beam currents. One measure of sensitivity is the inverse of the product (beam current×pattern acquisition time) that is necessary to achieve an acceptable percentage (e.g. 95%) of successfully indexed patterns.

As shown in U.S. Pat. No. 8,890,065, sensitivity in measuring the diffraction signal with an electron counting EBSD detector is expected to be improved by using a discriminator to only accept pulses greater than a threshold level equivalent to a certain energy. The signal/background should improve as this threshold is raised and optimum results should be achieved with the threshold close to the primary beam energy. Indeed, Vespucci et al. (S. Vespucci et al., "Digital direct electron imaging of energy-filtered electron backscatter diffraction patterns," Phys. Rev. B—Condens. Matter Mater. Phys., vol. 92, no. 20, pp. 8-14, 2015.) have shown that diffraction contrast measured from band intensity i.e. ((maximum minimum)/(maximum+minimum)) is improved by increasing the threshold closer to the beam energy and improvements in contrast of a factor of 4 can be achieved by raising the threshold from 5.5 keV to 19.4 keV when collecting an EBSP from diamond at an incident beam energy of 20 keV.

However, when diffraction patterns were processed using a similar embodiment of equipment shown in U.S. Pat. No. 8,890,065, it was discovered that, whereas the use of higher threshold levels improves the contrast in diffraction patterns and allows higher order diffraction features to be observed, the sensitivity would decrease with increasing threshold. A need exists for an improved system for detection of EBSD patterns that increases the sensitivity when used for orientation mapping applications.

SUMMARY OF THE INVENTION

In accordance with a first aspect of the invention there is provided an apparatus for detecting Kikuchi diffraction patterns, the apparatus comprising: an electron column adapted in use to provide an electron beam directed towards a sample, the electron beam having an energy in the range 2 keV to 50 keV, and; an imaging detector for receiving and counting electrons from the sample due to interaction of the electron beam with the sample, the detector comprising an array of pixels and having a count rate capability of at least 2,000 electrons per second for each pixel, wherein: the imaging detector is adapted to provide electronic energy filtering of the received electrons in order to count the received electrons which are representative of the said diffraction pattern, and the particle detector has an inert layer on the surface where the electrons enter towards the active region of the detector, wherein the inert layer disperses the detected energy of 20 keV incident electrons with an energy spread having a full-width half maximum less than 3.2 keV.

In this context, a "particle detector" refers to a detector that converts the energy of each received particle into an electronic signal as opposed to an "indirect" detector that for example converts particle energy to light with a phosphor screen and uses intermediate optics to focus the light on to the sensor. The inefficiencies involved in optical elements for indirect detectors lead to a loss of detection sensitivity. Furthermore, indirect detectors typically generate a signal current that is representative of the energy×rate product for a stream of incident particles, whereas a particle detector can measure the signal from a individual particle.

The term "pixel" here refers generally to spatially separate sensitive regions of the detector, such that particles incident on two different pixels will be deemed to have hit two different regions of the detector. Therefore, "pixel" may refer to a conventional array of pixels in a direct electron detector or CCD as is known in the art, as well as independent regions of a silicon strip detector for example, where each "pixel" here is the region associated with each contact strip.

It has been found that the imaging detector being adapted to provide electronic energy filtering of the received electrons in order to count, or more specifically to count preferentially, those received electrons which are representative of the said diffraction pattern is advantageous, particularly in that this "thresholding" can improve the ratio of relevant diffraction information to diffuse background information that is not representative of the diffraction pattern. The inventors have realised that it is possible to achieve significant improvements to this approach using an apparatus according to the first aspect. This is achieved by way of an inert or "dead" layer comprised by the detector that causes the energies of electrons that pass therethrough to be dispersed to a lesser degree than with conventional devices. In other words, the apparatus is able to reduce the dispersion of recorded signals by the effects of relatively thick inactive layers that have conventionally been used at the entrance to sensors.

The "dead" layer is described in this disclosure as "inert", in the sense that the term refers to an inactive material. As is explained in greater detail later in this disclosure, typical detectors employ a layer of such material to form an electrical connection to the active sensor layer. This inert, inactive, or "dead" layer may be thought of as a detector entrance window.

By reducing the spread in electron energies that is created by transmission through the inert layer, the discrimination or division of diffraction-relevant electrons from non-relevant electrons by way of thresholding is made more effective. That is, the range of recorded signals attributable to electrons that do have diffraction information is reduced, by comparison with existing devices.

The inert layer being adapted or formed such that, or in particular having a thickness and material properties such that, it disperses the detected energy of 20 keV incident electrons with an energy spread having a full-width half maximum less than 3.2 keV results in this advantageous effect. It will be understood that this means that, for 20 keV incident electrons, the layer causes a spread in transmitted electron energies such that the width of the energy spectrum curve of electrons transmitted through the layer, as measured between those energy values which are half the maximum of the energy peak or curve.

Preferably, the inert layer disperses the detected energy of 20 keV incident electrons with an energy spread having a full-width half maximum less than 2 keV, more preferably less than 1 keV, more preferably still less than 0.1 keV.

Preferably, the electron column is a part of a scanning electron microscope (SEM) which provides beam energies in the range of 2 keV to 50 keV in normal operation. Typically, the arrangement will be such that the detector is on the same side of the sample as the electron source, such that the received particles have a component of their trajectory back along the electron beam axis with respect to the sample. However, the diffraction patterns can also be detected in transmission, where the detector is positioned on the opposite side of the sample to the electron beam. In this architecture the received particles do not have a component of their trajectory back along the electron beam axis, with respect to the sample. In transmission EBSD, the received "signal" consists of elastically scattered electrons that have travelled through the sample rather than having been reflected from it. It will be understood that the said energy range of 2 keV to 50 keV for the electron beam represents the useful energy range for EBSD as an SEM technique.

A minimum detector count rate capability is necessitated by the data rate of EBSD experiments. In some experiments, the data rate could easily reach 10,000 events per second, and thus the detector has a count rate capability, for each pixel, of 2,000 events per second, preferably 5,000 events per second, more preferably 10,000 events per second, and more preferably still 100,000 events per second. Such count rates are particularly important in this invention when each particle is indiscriminately received by the detector, and then filtered and counted, rather than particles being filtered before hitting the detector.

The detector has at least one particle counter for counting the received particles which are representative of the said diffraction pattern. The at least one particle counter has a count rate of at least 2,000 events per second, preferably 5,000, more preferably 10,000 events per second, and more preferably still 100,000 events per second. Most preferably the counter is capable of count rates of at least $1\times10^6$ events per second. This is particularly beneficial to the approaches to which the present disclosure is directed. In some implementations the array of pixels and the at least one particle counter are a unitary component with all of the features integrated onto one chip, these being generally termed a monolithic active pixel sensor (MAPS). However, in other implementations, the array of pixels is bump-bonded to the at least one particle counter and these are known as "hybrid" detectors or hybrid active pixel sensors (HAPS).

Preferably, each pixel has a corresponding particle counter providing a "one to one" mapping between the pixels and the particle counters. In architectures where there are different numbers of pixels and particles counters, a "one to many" or "many to one" relationship is created. Ideally, the particle counters are arranged in an array corresponding to, and with the same pitch as, the array of pixels, although other arrangements are envisaged. In a HAPS detector the array of pixels is bump-bonded to the array of particle counters; however, both arrays could be a unitary member, such as in a MAPS.

Even more preferably, each particle counter produces an individual output signal in accordance with the energy of each received particle. Where each pixel has a corresponding particle counter, this advantageously increases the rate at which incident events can be counted. Data rates in EBSD experiments could be as high as 10,000 events per second per pixel or greater. Where each pixel has a corresponding particle counter, each particle counter has a count rate capability of at least 2,000 events per second, preferably 10,000 events per second. Higher count rate capabilities are also envisaged, such as 100,000 events per second. Each pixel having a corresponding particle counter provides a distinct advantage in achieving suitably fast particle measurement over sequential readout detectors such as CCDs. Importantly, detectors used in the current invention must be capable of particle counting at a fast enough rate.

Preferably, the electronic amplifiers at each pixel introduce an electronic noise energy equivalent having full-width half maximum less than 2 keV and preferably less than 1 keV.

A further improvement that may be achieved in some embodiments relates to charge sharing, as is described in detail later in this disclosure. Preferably, the particle detector contains circuitry to detect and correct for charge sharing between pixels that can occur for a single incident particle. Mitigating the effects of charge sharing over pixel boundaries in this manner additionally reduces deleterious dispersion in recorded signals. Typically in such embodiments the circuitry is configured to perform, or achieves, the following: summing the electronic signal collected in a given pixel with electronic signals collected in neighbouring pixels; applying electronic energy filtering to the summed electronic signal in order to count received particles representative of the diffraction pattern; and assigning counted particles to a single pixel.

Preferably, the particle detector is configured to output both the time-of-arrival and magnitude of signals captured in every pixel, and a computer algorithm is used for, or is configured to perform: identifying instances whereby a single incident particle generates coincident electronic signals in a plurality of pixels; summing the plurality of electronic signals collected in the plurality of pixels generated by single incident particles; applying energy filtering to the summed electronic signal in order to count received particles representative of the diffraction pattern; and assigning counted particles to a single pixel.

In some preferred embodiments the ratio (active layer sensor thickness)/(pixel-to-pixel spacing) is less than 5.

Preferably the apparatus is configured such that the number of electrons counted per pixel during a pattern acquisition is read out as a data unit of 6 bits or less.

Preferably the camera sensor array has configurable pixel amplifiers adapted to allow more than one pulse length to be achieved to suit different pixel count rate and energy resolution requirements.

It will be understood that in practice the energy distributions for electrons that are representative of the diffraction pattern and those that are not, are typically not separate. The overlap between these distributions is preferably addressed by the filtering. Thus the electronic energy filtering is preferably adapted to distinguish between received particles having an energy representative, or more representative, of the said diffraction pattern and received particles having an energy representative, or more representative, of a background.

Typically the incident electron beam is incident at an angle in the range 45-90° with respect to the specimen surface plane. However, it is also envisaged that angles of incidence relative to the specimen surface that are outside of this range may be used, for example shallower angles such as those conventionally used for EBSD, as is explained later in this disclosure.

In accordance with a second aspect of the invention there is provided an apparatus for detecting Kikuchi diffraction patterns, the apparatus comprising: an electron column adapted in use to provide an electron beam directed towards a sample, the electron beam having an energy in the range 2 keV to 50 keV, and; an imaging detector for receiving and counting electrons from the sample due to interaction of the electron beam with the sample, the detector comprising an array of pixels and having a count rate capability of at least 1,000 electrons per second for each pixel, and wherein; the detector is adapted to provide electronic energy filtering of the received electrons in order to count the received electrons which are representative of the said diffraction pattern, the particle detector has an inert layer on the surface where the electrons enter towards the active region of the detector that disperses the detected energy of 20 keV incident electrons less than the energy spread induced by transmission through 1,500 nm of inert silicon.

Any of the properties and features described in relation to the preceding and following embodiments in this disclosure may relate to the apparatus of either or both of the first and second aspects.

In accordance with a third aspect of the invention there is provided a method for detecting Kikuchi diffraction patterns, the method comprising: providing, using an electron column, an electron beam directed towards a sample, the electron beam having an energy in the range 2 keV to 50 keV, and; receiving and counting, using an imaging detector, electrons from the sample due to interaction of the electron beam with the sample, the detector comprising an array of pixels and having a count rate capability of at least 2,000 electrons per second for each pixel, wherein the detector is adapted to provide electronic energy filtering of the received electrons in order to count the received electrons which are representative of the said diffraction pattern, and wherein the particle detector has an inert layer on the surface where the electrons enter towards the active region of the detector, wherein the inert layer disperses the detected energy of 20 keV incident electrons with an energy spread having a full-width half maximum less than 3.2 keV.

In accordance with a fourth aspect of the invention there is provided a method for detecting Kikuchi diffraction patterns using the apparatus according to the first or second aspects.

BRIEF DESCRIPTION OF THE DRAWINGS

Examples of the present invention will now be described, with reference to the accompanying drawings, in which.

DESCRIPTION OF EMBODIMENTS

Figure 1:
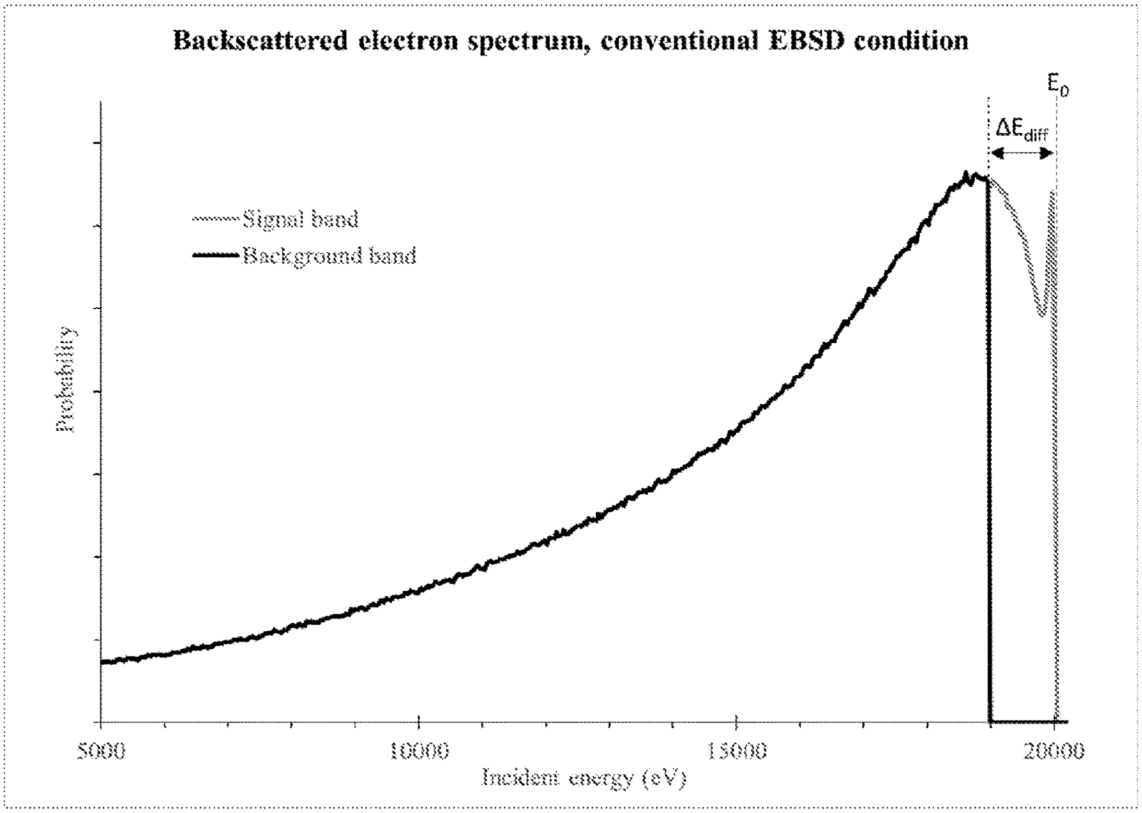
FIG. 1 is a graph showing an energy spectrum for backscattered electrons.

Within this disclosure particular definitions for 'signal' and 'background' are used, as illustrated in FIG. 1. Electrons that are subject to diffraction effects contributing to Kikuchi band contrast lie within an energy band of width $\Delta E_{diff}$ just below the primary beam energy. The majority of electrons are not diffracted into Kikuchi bands and are subject to multiple scattering events within the specimen that produce a continuum of energy losses. These scattered electrons have energies extending all the way down to zero energy and are responsible for a diffuse background in the camera image. Some of these scattered electrons will have energies within the same energy band $\Delta E_{diff}$ that contains electrons that are subject to diffraction effects. It is convenient to define two distinct energy bands to describe the scattered electrons incident on the detector: a 'signal band', with energy range $E>E_0-\Delta E_{diff}$, which contains substantially all signal electrons and also some background electrons; and a 'background band', with energy range $E<E_0-\Delta E_{diff}$, which contains a negligible number of signal electrons and can be considered to consist only of background electrons. An electron counting detector with a configurable threshold TH can be used to count only those electrons having an energy above TH.

The diffuse background varies only slowly across the image whereas the intensity in the region of a diffraction band varies rapidly. Thus, the (maximum−minimum) intensity observed in a diffraction band will be governed only by the number of electrons detected that are subject to diffraction effects $N_{signal}$ whereas (maximum+minimum) intensity will be governed by the total number of electrons detected, $N_{tot}$, that includes background electrons, $N_{background}$ thus $N_{tot}=N_{signal}+N_{background}$. The diffraction contrast ((maximum−minimum)/(maximum+minimum)) will thus depend only on $N_{signal}/(N_{signal}+N_{background})=1/(1+N_{background}/N_{signal})$ and will continue to improve with increasing TH provided the signal-to-background ratio $SBR=N_{signal}/N_{background}$ continues to increase.

An object of the approach now described is to improve the 'sensitivity' of an electron counting EBSD detector. The 'sensitivity' of an EBSD detector may be understood as being inversely related to the electron dose required to collect a diffraction pattern that can be analysed with a defined accuracy and precision. As discussed above, one way of defining accuracy and precision is the percentage success in indexing patterns from a particular specimen and fixed experimental conditions. The electron dose is defined as the total number of SEM primary electrons that the specimen is exposed to during acquisition of a diffraction pattern and is proportional to the product SEM primary beam current*exposure time. If the exposure time is high, the rate of pattern acquisition is reduced. If the electron dose is high some specimens may be damaged. Therefore, it desirable to employ a detector with high sensitivity so that EBSD patterns can be indexed successfully as fast as possible with minimum electron dose.

The emission of back-scattered electrons from a specimen is a randomised process, meaning that the energy and direction of an individual emitted electron is subject to a statistical distribution. The number of electrons incident on a single pixel of the detector during an EBSD pattern measurement therefore fluctuates around an average value according to a Poisson probability distribution. The partial randomisation of the signal magnitude in each pixel has the effect of introducing random "Poisson" noise to the EBSD pattern measurement that obscures Kikuchi diffraction contrast and makes pattern indexing more difficult.

It follows that the ease with which a signal can be detected is dependent on the magnitude of the signal relative to that of the noise introduced by statistical fluctuations that will be referred to here as the signal to Poisson noise ratio (SPNR). The sensitivity of an EBSD experiment increases as SPNR increases for a fixed experimental condition and electron dose.

For an EBSD pattern, the magnitude of the signal in a pixel is proportional to the average number of detected electrons carrying diffraction contrast, whereas the statistical noise is governed by Poisson counting statistics in the total number of detected electrons, therefore $$SPNR \propto \frac{|\text{Signal}|}{|\text{Poisson Noise}|} = \frac{\overline{N_{signal}}}{\sqrt{\overline{N_{tot}}}} = \frac{\overline{N_{signal}}}{\sqrt{\overline{N_{signal}+N_{background}}}} \equiv \sqrt{\overline{N_{signal}}}\,\frac{1}{\sqrt{1+\frac{1}{SBR}}} \quad (1)$$

SPNR and sensitivity clearly depend on both SBR and $N_{signal}$, and to maximise SPNR, the system needs to be configured for an optimum combination of SBR and $N_{signal}$.

Figure 2:
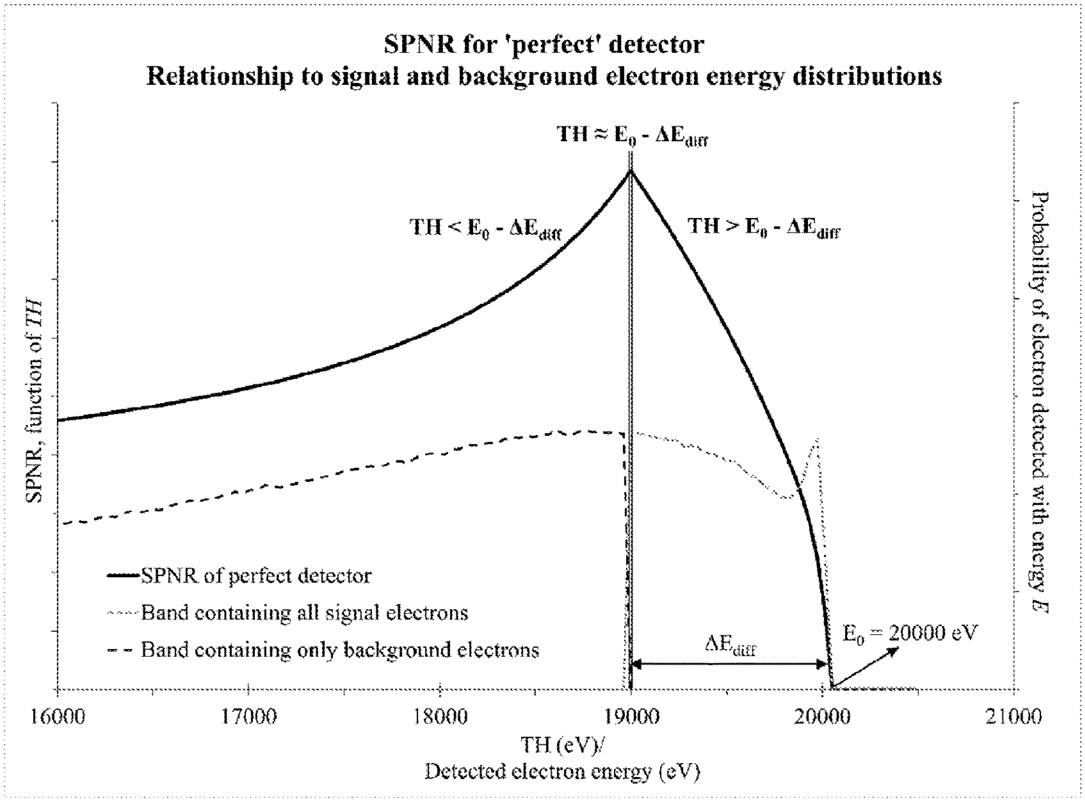
FIG. 2 is a graph showing signal to Poisson noise ratio as a function of configured threshold value.

For an electron-counting EBSD detector, both $N_{signal}$ and SBR are affected by TH, and it follows that SPNR varies as a function of TH. FIG. 2 shows how changing TH will affect SPNR. At very low TH values, all background and signal electrons are detected. As TH is raised, background electrons are excluded and SBR increases but $N_{signal}$ stays the same so that SPNR also increases. For a theoretical, 'perfect' electron detector (perfect in that it detects every incident electron and measures its energy without error) SPNR will continue to rise with increasing TH until $TH=E_0-\Delta E_{diff}$ because any higher value of TH will then exclude some signal electrons that carry diffraction contrast and thus reduce $N_{signal}$. As TH is raised above $E_0-\Delta E_{diff}$, a few more background electrons will be excluded, however the most significant effect is that a fraction of signal electrons carrying diffraction contrast will not be detected. SPNR therefore falls mainly as a result of lower $N_{signal}$. Therefore, for a perfect electron detector, the optimum SPNR and sensitivity would be achieved by setting TH close to the value $E_0-\Delta E_{diff}$.

The relative increase in SPNR possible from energy thresholding is greater for specimens and experimental conditions in which the fraction of background electrons emitted from the sample is greater. This is due to the larger possible improvement in SBR if only signal electrons are selectively detected. As an example, for a number of practical reasons it is preferable to perform EBSD analysis with the beam incident at a large angle (in the range 45°-90°) with respect to the specimen surface plane (a 'large-angle' condition). However, in this condition a significantly larger fraction of the emitted backscattered electrons are background electrons, as compared with conventional experiments performed with the beam incident at a small angle (~20°) relative to the specimen surface. EBSD experiments are therefore rarely performed in large-angle conditions due to prohibitively low SPNR and sensitivity. If SPNR is improved through energy thresholding, EBSD analysis of specimens using large-angle conditions can be achieved at higher rates or lower beam currents.

Electronic Noise and Pulse Pile-Up

Figure 3:
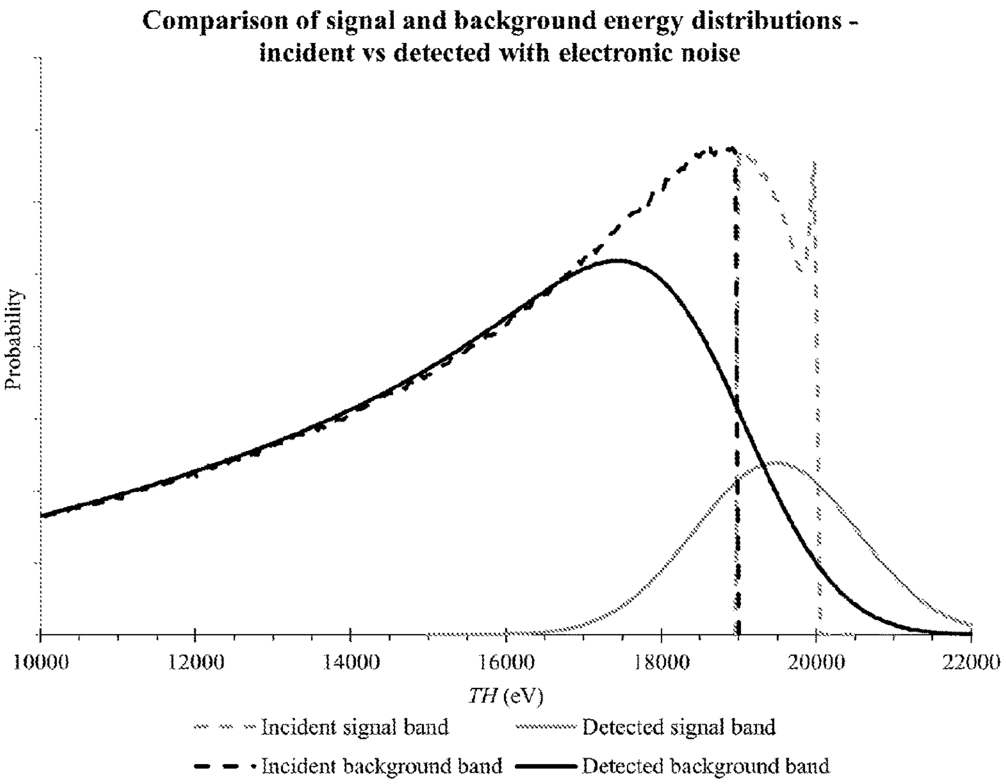
FIG. 3 is a graph showing signal and background energy spectra for incident and detected signals.

FIG. 2 shows the ideal case but in a practical detector, the relationship between TH and SPNR is complicated by a combination of physical effects. One known issue is that the pulse amplitude due to a single incident electron will be subject to electronic noise. Therefore, any diffracted electron with incident energy above TH may not be detected if the electronic noise reduces the amplitude below TH. Similarly, any diffuse background electron with incident energy below TH may still be detected if the electronic noise fluctuation takes the amplitude above TH. For a TH set close to $E_0-\Delta E_{diff}$, these effects limit both SBR and $N_{signal}$ in the acquired EBSD pattern. FIG. 3 shows how electronic noise with full-width half maximum (FWHM) 2 keV affects the measurement of both signal and background bands by effectively spreading the measured values both above and below the true energy. When TH is set at $E_0-\Delta E_{diff}$, which would be close to optimal in a perfect detector, some signal electrons fall below TH because of noise fluctuations and this reduces $N_{signal}$ and SPNR. If TH is reduced, that will increase the number of signal electrons but will also allow more background electrons to be detected. Consequently, the optimum value of SPNR is achieved with TH slightly below $E_0-\Delta E_{diff}$ and is below the SPNR that can be achieved with a perfect detector.

The effective blurring of the energy threshold due to electronic noise is typically reported as the "energy resolution" of a particle counting camera but the associated effect on EBSD "sensitivity" for pattern solving (as defined above) has not been recognised. Vespucci et al performed EBSD experiments using a camera with electronic noise FWHM of 2 keV. If the magnitude of electronic noise is reduced to 1 keV FWHM, our simulations predict that an improvement of up to 30% can be achieved in the optimal SPNR.

In order to maximise SPNR for EBSD, it is therefore desirable to minimise the electronic noise contribution to measurement. Electronic noise can be improved through design and fabrication of the imaging sensor but is also affected by the choice of electronic filtering on the read-out amplifiers for each pixel. If the filter time constants on each pixel amplifier are increased, this reduces voltage noise and will allow the threshold TH to be set higher to improve the optimum SPNR and sensitivity for EBSD pattern solving. However, if the time constants are increased, that increases the probability that pulses due to the arrival of individual electrons will not be resolved. Because the pulse arrival times are Poisson-distributed in time, the probability of 2 pulses arriving within the resolving time of the pixel amplifier will increase with count rate. Most electrons hitting the detector are diffuse background electrons, so any unresolved coincidences are more likely to occur between 2 background electrons. When such a "pile-up" occurs, the measured pulse height will be approximately the sum of the pulse heights that would be seen from the individual events and may exceed TH even when neither of the individual pulses would have exceeded the threshold if they had not arrived together. Therefore, when average pixel count rates are of the same order as the reciprocal of pulse pair resolving time, pile-up will allow more background events to be accepted and thus degrade the SPNR.

When an EBSD pattern is obtained by a camera, the pixel counting rate is directly affected by the beam current incident on the specimen. When spatial resolution or specimen damage is of concern, it is preferable to use a lower beam current, in order to reduce the specimen dose and the lateral size of the focused electron beam. In this situation, the pixel count rate will be low and it is advantageous to increase the filtered pulse duration for the pixel amplifiers to reduce electronic noise and allow higher SPNR and EBSD sensitivity to be achieved through thresholding. In situations where the specimen can withstand high dose and the SEM can be operated at high beam current without compromising spatial resolution, then the acquisition time for each EBSD pattern can be reduced because of the high pixel counting rate. In this case, the pixel amplifier filters need to give a pulse length that is short enough to avoid significant pile-up. Although the associated increase in electronic noise will reduce the SPNR attainable for a fixed number of counts in the image, increasing the number of counts will improve the SPNR so that EBSD pattern solving can still be achieved at a higher rate than with lower beam current. To provide for a range of different types of specimen and spatial resolution requirements, it is advantageous for the camera sensor array to have configurable pixel amplifiers that allow more than one pulse length to be achieved to suit different pixel count rate and energy resolution requirements.

Localised variations exist in the properties of any real sensor, including in the electron transport properties of the sensor layer, or in the electron counting circuitry. Due to these variations, the response to an incident electron will vary from pixel to pixel. Therefore, in practice, if TH is set to the same nominal level in all pixels, the range of incident electron energies producing a count is not uniform for all pixels. When averaged over all pixels, this effect blurs the energy threshold additionally to effects introduced by electronic noise.

Some particle-counting detectors already incorporate features to compensate for the variable pixel threshold effect to increase the uniformity of energy filtering characteristics across all pixels. These features typically apply a 'shift' to the local electronic threshold in each pixel in order to equalise the energy-filtering characteristic of all pixels. These 'threshold trimming' features improve the energy-filtering resolution of the sensor as a whole.

Further, we have discovered that the benefits of using a particle counting camera to improve sensitivity for EBSD cannot be realised unless the camera includes at least two further critical features related to the entrance window and the incidence of charge sharing between pixels.

Sensor Dead Layer and Energy Dispersion

Figure 4:
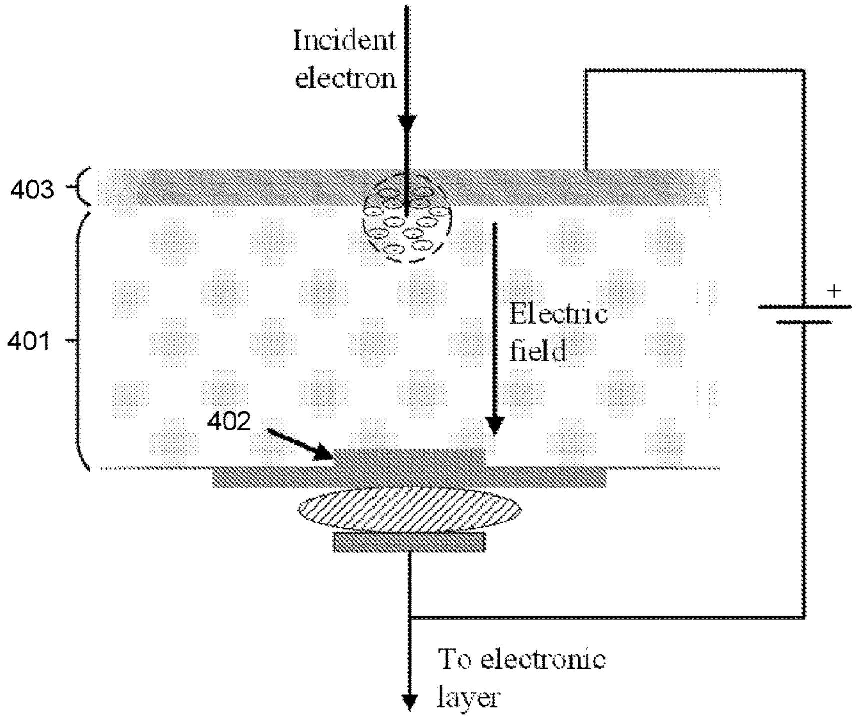
FIG. 4 is a schematic drawing of a single pixel of an example particle counting detector.

A particle-counting detector comprises an active sensor layer in which the energy of the incident particle is absorbed by a series of interactions that liberate electron hole pairs. FIG. 4 shows a cross-sectional schematic around a single pixel. A cloud of charge is formed and is swept by an internal electric field towards a collection electrode 402 where the amount of charge liberated is measured and this signal charge is normally proportional to the energy of the incident particle. The depth into the sensor at which the charge is liberated depends on the type of incident particle (e.g. X-ray or electron) and the particle's energy. For an incident electron, the higher the energy, the deeper the penetration into the active sensor layer 401, but the electron must first pass through the inactive material used to form the electrical connection to the active sensor layer. This inactive layer 403 effectively forms the "entrance window" for the sensor. If the incident electron loses any energy by an inelastic interaction within this layer, that energy will not contribute to the signal charge so the layer is sometimes referred to as a "dead layer". Furthermore, some of the charge liberated near to the dead layer may re-combine before it can be swept to the collection electrode and this can cause some further loss of signal charge. Consequently, energy may be lost as the incident electron traverses the dead layer and some liberated signal charge may be lost before it is collected and therefore the measured energy may be less than the incident electron energy.

As explained by Segal et al. (J. D. Segal et al., "Thin-Entrance Window Sensors for Soft X-rays at LCLS-II," 2018 IEEE Nuclear Science Symposium and Medical Imaging Conference Proceedings (NSS/MIC), 2018, pp. 1-2, doi: 10.1109/NSSMIC.2018.8824674), fully depleted high resistivity silicon sensors require a doped contact at the entrance window to terminate the diode. Conventionally, this region has been created by ion implantation of the dopant species, followed by a high temperature anneal to activate the dopant. This anneal also drives the dopant profile deeper, increasing the depth of the inactive layer. In addition, a superficial metal layer is usually deposited on top of the doped surface layer and connected to a bias voltage. Thus, in existing devices, a surface metal layer of 1 micron of Aluminium on top of a 2 micron thick implant into the silicon is typically used for X-ray pixel sensors. When the pixel sensor is used to detect X-rays above a few keV, the small fraction of X-ray photons that are absorbed in the inactive layer will not give rise to any signal but any photon that reaches the active region will generate a charge signal proportional to full energy of the photon. Thus known pixel detectors comprise comparatively thick dead layers that have little effect for x-rays (or high-energy (100 keV) electrons), but have a significant impact for applications to which the present disclosure is directed.

When a direct detection semiconductor sensor with thresholding capability is used for imaging electrons in a transmission electron microscope where electron energies typically exceed 100 keV, the thickness of the dead layer is not critical. The high energy of the incident particles ensures that any energy losses due to the dead layer are relatively low and setting the threshold at roughly half the incident energy will usually ensure that all particles are counted and the threshold is high enough not to give false triggering due to electronic noise excursions. However, in an SEM where the beam energy may be only 20 keV or less, the effect of the dead layer can be significant.

Figure 5:
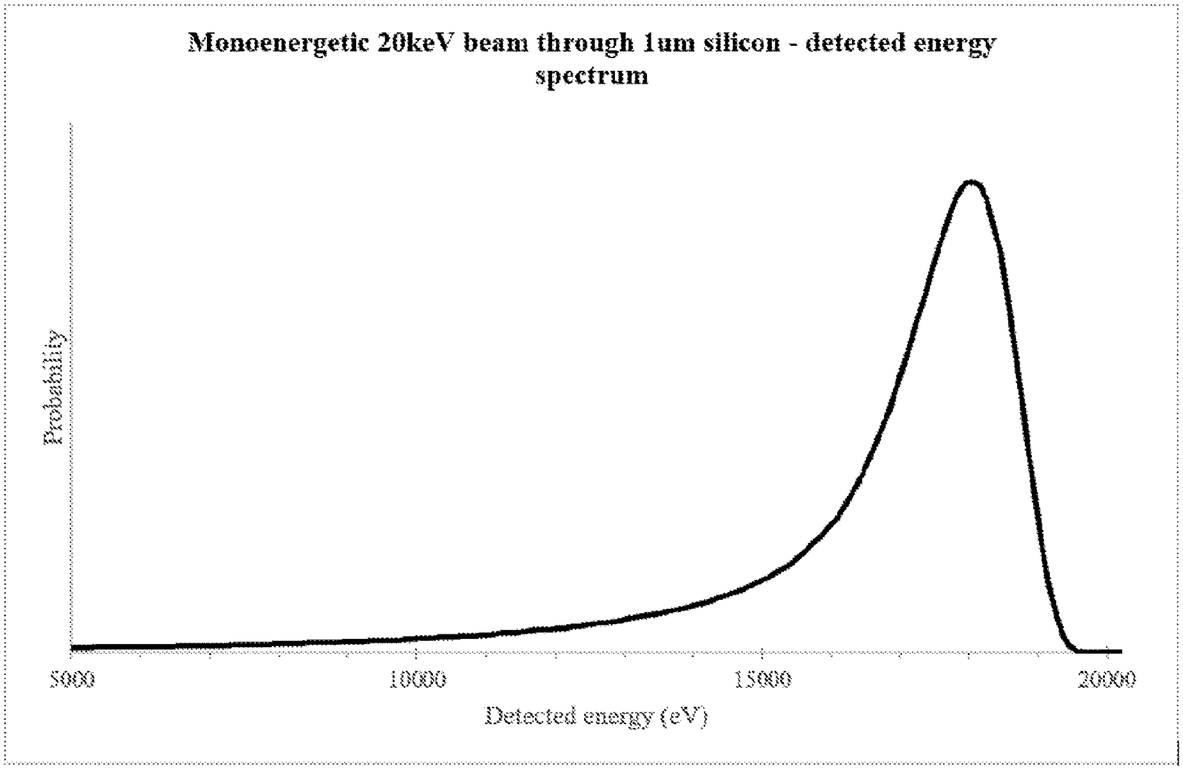
FIG. 5 is a graph showing an energy spectrum for a monoenergetic 20 keV beam through 1 μm silicon.
Figure 6:
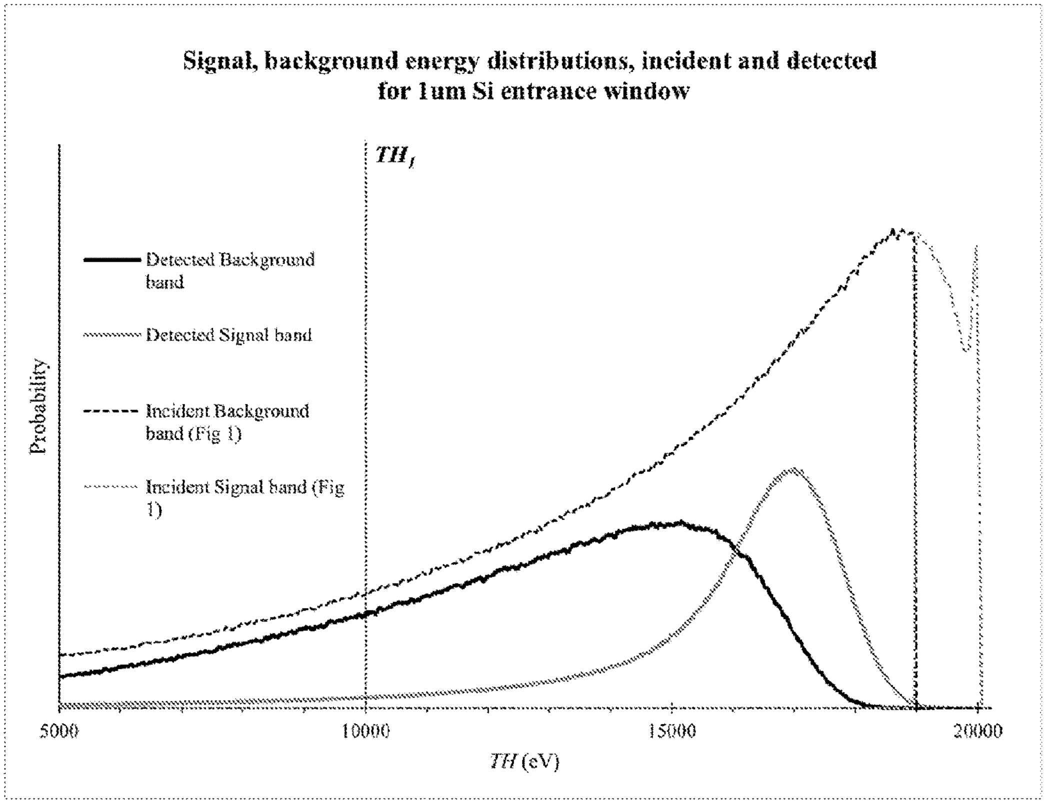
FIG. 6 is a graph showing signal and background energy spectra for incident and detected signals with a 1 μm silicon entrance window.

FIG. 5 shows how the spectrum of an incident, 20 keV monochromatic electron beam (a sharp peak at 20 keV energy) would be modified on transmission through a 1 micron dead layer of silicon. The electrons lose a variable amount of energy as a result of many random scattering interactions in the layer and this not only produces a reduction in mean energy for the transmitted electrons but also the energies are dispersed over a wide range. Diffracted electrons contributing to N-signal in the small band $\Delta E_{diff}$ close to the beam energy would suffer similar energy loss and dispersion. FIG. 6 shows a schematic depicting how the measured energy distributions of signal and background bands would be detected following transmission through such a dead layer, compared to the true incident distributions that would be detected by a 'perfect' electron detector. The effect of the dead layer on these low energy electrons is to blur both signal and background distributions so that they overlap significantly, and this overlap reduces the ability to separate the contributions by thresholding.

Figure 7:
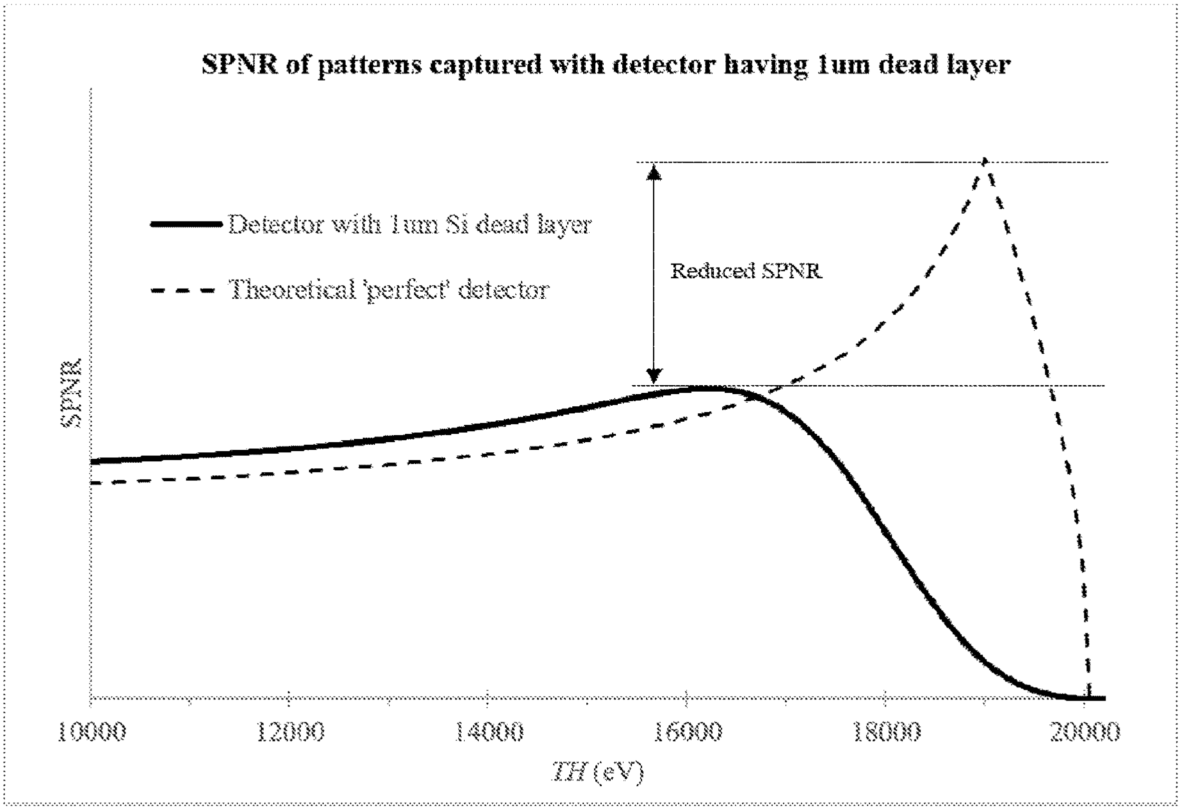
FIG. 7 is a graph showing signal to Poisson noise ratio for patterns detected with a detector having a 1 μm dead layer.

If TH is set at a level low enough to capture substantially all signal electrons and maximise $N_{signal}$ in the measured EBSD pattern (for example, $TH_1$ in FIG. 6), a high proportion of background electrons $N_{background}$ will still be detected resulting in patterns with much lower SPNR compared to what could be achieved with thresholding in a perfect detector. Optimising SPNR for a detector having a significant dead layer requires a trade-off between $N_{signal}$ and SBR; the best-achievable SPNR and sensitivity is therefore significantly worse than that possible with a theoretical 'perfect' detector. This effect is demonstrated in FIG. 7, which illustrates the relationship between SPNR and TH for a theoretical perfect detector and one with an entrance window equivalent to a dead layer of 1 micron of Silicon.

A dead layer is a necessary feature of any semiconductor sensor because of the need to make electrical contact with the depleted zone that forms the active region of the device. Special fabrication techniques exist which reduce the effective dead layer thickness enough to allow low energy photons to reach the active region and be detected. However, for EBSD where low energy electrons are involved, in order to exploit the benefits of energy thresholding, it is not simply transmission through the dead layer that is important but it is also the effective spreading of energy (dispersion) that occurs for monochromatic electrons after they have travelled through the layer. This energy spreading occurs because the combined effects of inelastic scattering in the dead layer and incomplete charge collection results in a variation of the signal obtained from electrons of fixed energy. Typical entrance windows on direct detection semiconductor detectors consist of a metal contact and an implanted layer that cause energy dispersion of the detected signals from 20 keV incident electrons in excess of the energy dispersion that would be caused by transmission through a 2 micron layer of silicon. The inventors have determined that, in order to exploit the advantage of thresholding to improve the sensitivity for EBSD pattern solving, the dead layer, including any metal contact, must be reduced so that the effective energy spread of a 20 keV electron beam is less than that caused by a 1500 nm layer of inactive silicon.

Figure 8:
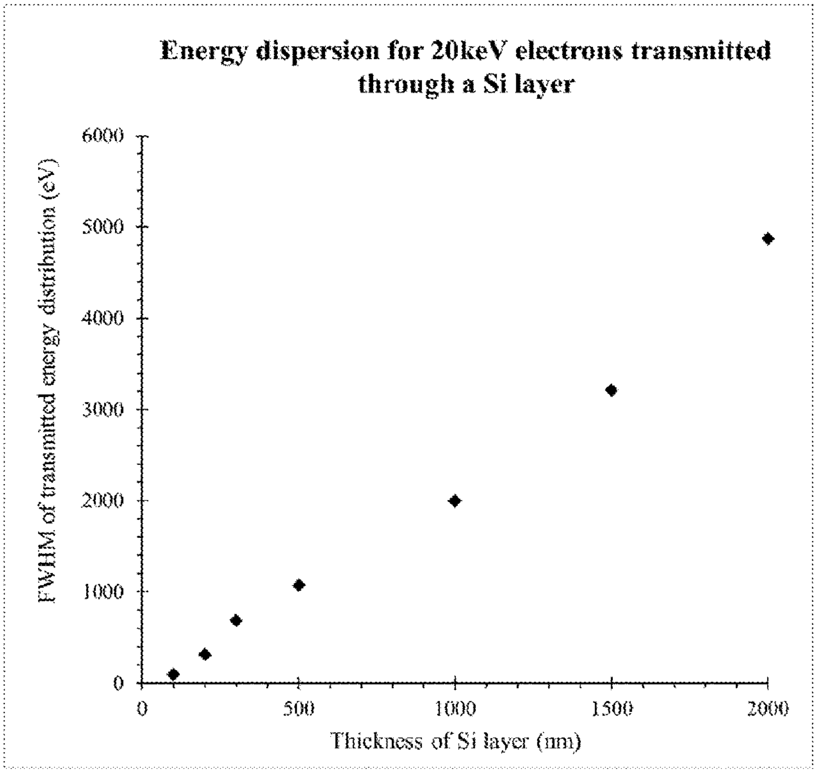
FIG. 8 is a graph showing calculated electron energy dispersion for 20 keV electrons transmitted through silicon layers of different thickness.

It is well understood that when electrons pass through a thin layer of material, the energy spread increases with the thickness of the material. This relationship between thickness and energy spread can be approximated by mathematical expressions (as described in Mikheev, N. & Stepovich, Mikhail & Yudina, S. (2009). "Energy loss spectra for a fast charged particle beam transmitted through a material film of specified thickness", Journal of Surface Investigation-x-ray Synchrotron and Neutron Techniques—J SURF INVESTIG-X-RAY SYNCHRO, 3. 218-222. 10.1134/S1027451009020086), or more commonly by electron transport simulations (as described in Attarian Shandiz, M., Salvat, F. and Gauvin, R. (2016), "Detailed Monte Carlo Simulation of electron transport and electron energy loss spectra", Scanning, 38: 475-491. https://doi.org/10.1002/sca.21280). As an example, the energy spread of an initially monochromatic (single-energy) beam of 20 keV electrons after transmission through a silicon layer of various thicknesses is shown in FIG. 8, with the energy spread described as the full-width at half maximum (FWHM) of the energy distribution after transmission through the silicon layer. Approaches such as these mathematical models and simulation software can be used to calculate the relationship between energy dispersion and entrance window thickness. Those techniques can therefore be used for calculating energy dispersion by the dead layer and so may be used in identifying appropriate physical, material, and geometrical properties for an inert layer according to the present disclosure.

In a silicon detector, the material at the entrance is typically modified by ion implantation to make a conductive contact and a semiconductor p-n junction. The conductive region will not contribute any signal, so there is effectively a dead layer at the entrance to the detector active region. Therefore, when electrons enter the detector they must pass through a thin layer of inactive silicon that will spread or disperse the distribution of electron energies before reaching the active region. Reducing the energy-dispersive effect of the dead layer will increase the SPNR available from the detector and this is achieved by using fabrication techniques that reduce the thickness of the dead layer. Although the electrical properties of the silicon are modified by ion implantation, the electron scattering properties are not affected and the effect of a dead layer on the measured energy of electrons incident on the sensor is equivalent to the effect of electron transmission through a silicon layer of the same thickness as the dead layer. Besides ion implantation, other processing methods may be used and additional thin surface layers such as oxides and nitrides may be involved.

If there are other materials on the entrance surface, they will similarly increase the energy dispersion for electrons reaching the active region of the detector. However, for this invention the relevant aspect of the entrance window is the amount by which it disperses the energy of electrons transmitted through it, regardless of layer thickness or the material(s) of construction. For EBSD, it is convenient to describe the energy-dispersive effect of a dead layer in terms of the full width at half maximum (FWHM) of the energy distribution of an initially monochromatic (single-energy) beam of 20 keV electrons after transmission through it. Given this value, the effect of an entrance window on electrons of different incident energy is predictable (for example, by using electron transport simulations, as in Shandiz et al).

Figure 9:
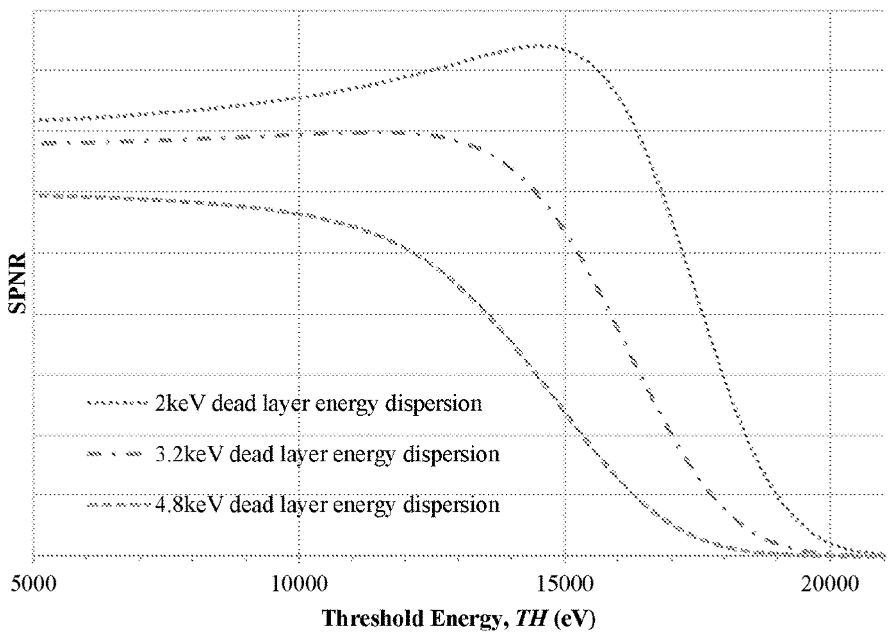
FIG. 9 is a graph showing a relationship between signal to Poisson noise and threshold energy when applied using detectors having different dead layer thicknesses and energy dispersion properties.

It has been calculated that if a dead layer induces an energy dispersion of 3.2 keV FWHM or above on a 20 keV monochromatic electron beam (equivalent to the effect of a 1500 nm Si inactive layer), the SPNR of patterns acquired by a realistic detector cannot be affected meaningfully by applying a detection energy threshold TH, as shown in FIG. 9. The graph shows simulated SPNR curves (similar to those in FIG. 7) for detectors of different dead layer thicknesses. For these examples, an energy dispersion of 2 keV corresponds to a 1,000 nm-thick dead layer, a 3.2 keV dispersion corresponds to a 1,500 nm-thick dead layer, and a 4.8 keV dispersion to a 2,000 nm-thick dead layer. For the 3.2 keV dispersion case, it can be seen that the energy-filtering concept brings a negligible benefit to SPNR, while the depicted greater and smaller dispersions respectively result in worse SPNR and a significant SPNR improvement. That is, for the 3.2 keV dispersion, as TH increases, SPNR increases, but by a lesser degree than the 2 keV case. It is for this reason that the present apparatus advantageously includes a dead layer that induces an energy dispersion of less than 3.2 keV on a 20 keV monochromatic beam of electrons incident normally to the sensor.

It will be understood that the results shown in FIG. 9 depend on other aspects of the detector that are included in the SPNR simulations. The simulations for this example apply for a detector that, firstly, sees no charge-sharing effects (e.g. uses some form of charge summing algorithm, and, secondly, comprises electronic amplifiers that introduce an electronic noise equivalent of full-width half maximum ~2 keV. If, instead, performance were simulated for a detector with additional deleterious factors such as charge-sharing effects and a high degree of noise on the electronic amplifiers, the SPNR curves would indicate the need for a significantly lower dead layer energy dispersion in order for the apparatus to achieve the desired SPNR improvement.

In typical example apparatuses, the particle counter has pulse processing electronics, wherein each "event" to be counted is a pulse of charge created by an incident particle depositing energy in a pixel. The pulse-processing electronics include an amplifier, a discriminator and a counter. An important aspect of the apparatus is the count rate of the detector. The rate of incident particles hitting a detector in an EBSD experiment could be 10,000 events per second. Therefore, in order to discriminate between particles of different energies, the particle counters of the detector must each be capable of counting at a count rate of 2,000 events per second. Preferably, the particle counters can count at a rate of 10,000 events per second and more preferably at 100,000 events per second. Importantly, whether or not each pixel has its own particle counter, the architecture of the detector is such that it has a count rate capability of at least 2,000 events per second per pixel.

The type of detector described in typical embodiments is a "direct detector". Such a detector is capable of detecting any type of particle satisfying the energy thresholds, for example electrons, X-rays and light photons. The invention is not limited to direct detectors however, and other types of detector can be used that are capable of imaging and particle counting at a suitable rate per pixel. The direct detector could have a surface coating such as a scintillator that converts energy to light, provided the response time is short enough to allow the signal from individual particles to be resolved. One example of another direct detector type that could be used is a silicon strip detector. Detectors using sequential readout such as CCDs generally are unable to count at a fast enough rate; however, in principle such detectors can be used.

Figure 10A:
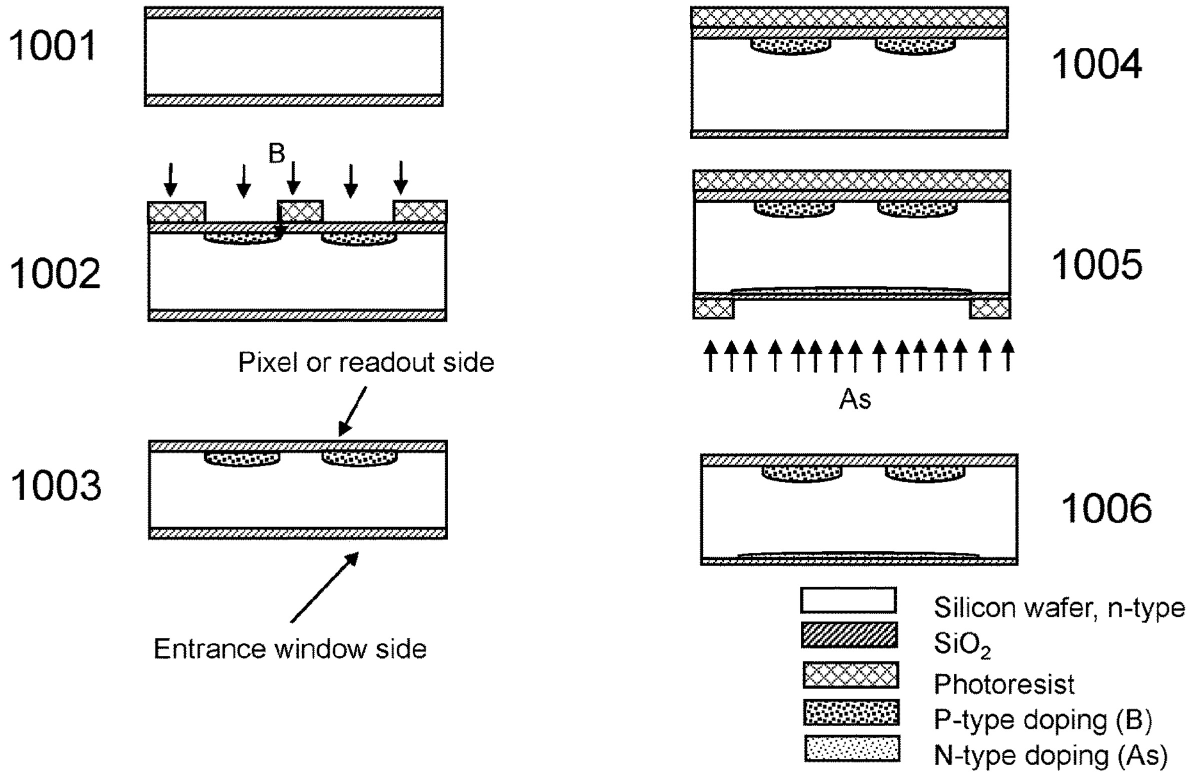
FIGS. 10A and 10B schematically show multiple stages of a process of producing an example imaging detector having a dead layer according to the invention.
Figure 10B:
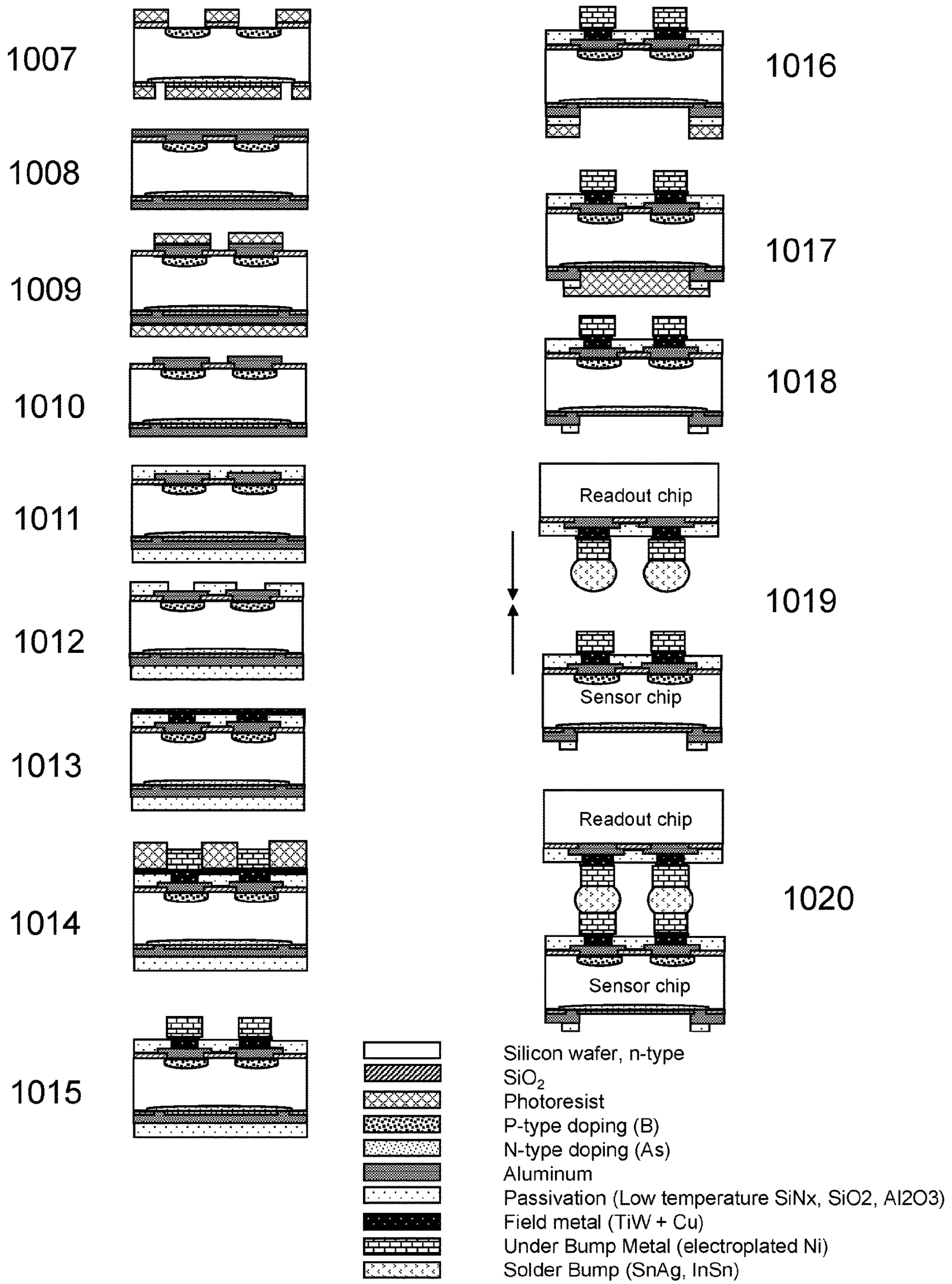
Figure 11:
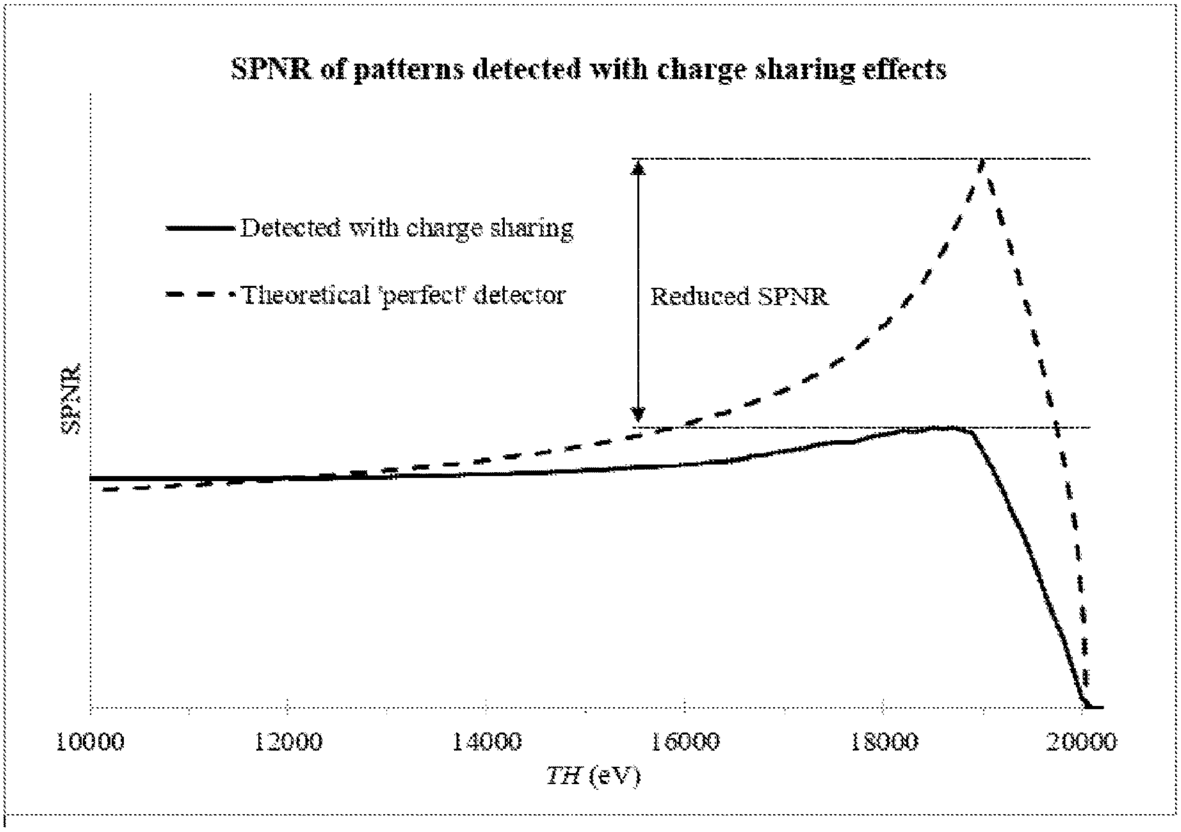
FIG. 11 is a graph showing signal to Poisson noise ratio for patterns detected with charge-sharing effects.

An example fabrication process for forming a detector according to this disclosure is shown in FIGS. 10A and 10B. At stages 1001 to 1020 the device is depicted at multiple stages of its manufacture. The resulting device is an imaging detector that has an inactive layer on the surface with a thickness of less than 100 nm, which produces the requisite low energy dispersion in transmitted electrons. In the present example the sensor is bonded to a Medipix3 readout chip. An approach described in U.S. Pat. No. 8,890,065 involves using a Medipix2 readout chip. That readout chip comprises an array of 256×256 pixels, each of area 55 $\mu m^2$, and is capable of counting at up to $\sim 1 \times 10^6$ counts per second. Medipix3 is now preferred, having the additional functionality of on-chip charge-sharing correction and configurable counter depth, B (both discussed below).

Example materials from which the illustrated components are formed are shown in the key in each of FIG. 10A and FIG. 10B.

At stage 1001, 100-300 nm layers of $SiO_2$ are deposited on an N-type silicon wafer. At 1002, photoresist patterning and Boron implantation are performed. Removal of the photoresist and activation by standard annealing is shown at 1003. At 1004 the $SiO_2$ layer on the entrance window side of the wafer is thinned, with a protective photoresist layer being disposed on the readout side. Arsenic is implanted onto the entrance window side at 1005, by way of ion implantation using an ion energy in the range 5-15 keV. Activation is performed by microwave annealing at 1006. Conventionally, annealing is performed at temperatures in excess of 700° C., which would result in significant diffusion of the arsenic dopants in the silicon. The microwave annealing at 1006 in the present example allows the activation of dopants without raising the temperature of the bulk silicon above 500° C., and this gives rise to negligible diffusion. The photoresist typically does not withstand the annealing process, and is removed at this stage. Electrical contact openings to the implanted regions are etched at 1007. At 1008 aluminium is deposited on both sides by way of sputtering. The aluminium on the pixel side is pattered by way of etching at 1009, and the resist is removed at 1010. Passivation layers are then deposited (for example by way of plasma-enhanced chemical vapour deposition (PECVD), using $SiO_2$, SiN, or by atomic layer despoition (ALD) using $Al_2O_3$, at low temperatures, less than 400° C.) at 1011. At 1012 the passivation layer on the readout side is patterned by way of lithography and etching. 1013 shows the deposition of field metals (Ti—W+Cu or Au) by sputtering. This is needed for the electroplating used to deposit an under bump metal (Ni) as shown at 1014. The photoresist used for that deposition is then removed at 1015. The passivation layer and aluminium is the removed from the entrance window, as shown at 1016. An opening to the aluminium contacts of the entrance window is etched at 1017, and the photoresist used in that etching process is subsequently removed, at 1018. The wafers are then diced (not shown) to produce sensor chips and readout chips. At 1019, field metals and under bump metals have been produced similarly for a readout chip, which is depicted in addition to a sensor chip, and the solder bumps have been electroplated. Finally, the sensor chip and readout chip are bump bonded together at 1020.

Charge Sharing

A further problem with pixel detectors is that parts of the spreading charge cloud generated by a single, incident particle may reach the readout electrodes for neighbouring pixels so that the charge liberated by a single input particle is effectively shared between a pixel and its close neighbours. This is more likely to occur when the incident particle enters the sensor close to a pixel boundary. When a pixelated detector is used for detecting photons, this “charge sharing” effect is known to cause some degradation in imaging resolution because of the spread of response away from the central pixel. However, for pixel detectors with thresholding, if the charge collected in a neighbouring pixel is low, then the pulse for that pixel may not exceed TH. If only the central pixel pulse exceeds TH then the full imaging resolution is maintained. Thus, to optimise the spatial resolution and avoid multiple pixels counting the same photon when using a single photon counter with a monochromatic beam, the threshold is typically set at 50% of the incident photon energy.

We have found that for EBSD this charge sharing can seriously limit the extent to which SPNR can be improved by thresholding. In EBSD, because electrons have energies typically 20 keV or less, an electron incident on the sensor is absorbed close to the entrance surface so that the liberated charge cloud must drift almost the entire depth of the sensor before reaching the readout electrode. Lateral diffusion increases the chance that some charge crosses the boundary between two pixels as the cloud drifts. The degree of charge sharing varies depending on where the incident electron falls relative to a pixel boundary. This causes a variable reduction in the pulse amplitude so that some signal electrons that would normally be counted are now rejected because the resultant pulse falls below TH. This effect is most apparent when TH is set close to the primary beam energy $E_0$.

The example in FIG. 2 illustrates that for a theoretical perfect detector, SPNR and sensitivity for EBSD may be optimised when TH is set to approximately $E_0-\Delta E_{diff}$. Typically, $E_0$ may be 20 keV, and $\Delta E_{diff}$ may be 1 keV, with TH set accordingly to 19 keV. In this example, a signal electron incident with 20 keV energy (ie, above TH) would therefore not be counted if >1 keV (5%) of the deposited energy is shared with another pixel. For a pixel detector 300 μm in depth with 55 μm×55 μm pixels, we have estimated that more than 60% of 20 keV signal electrons are incident close enough to a pixel boundary so that >1 keV of the deposited energy is not collected by the pixel on which the electron was incident. The measured electron energy will fall below TH in these cases, and more than 60% of signal electrons will not be detected despite having incident energy above TH.

Although the reduction in pulse amplitude in a photon detector can be mitigated by reducing TH, in EBSD, reducing TH will reduce SBR, causing a degradation in SPNR and sensitivity for pattern solving. The variable loss of charge from the pixel upon which an electron is incident produces a result similar to the energy loss and spreading that occurs when the incident electron scatters within the inert material of the dead layer. As with energy lost in the dead layer (FIGS. 6 and 7), when there is charge sharing, the optimum SPNR is reduced relative to a perfect detector, and is achieved at a lower value of TH than with a perfect detector.

From the description of the mechanisms of charge sharing above, it will be appreciated that charge sharing can, to some extent, be reduced by appropriate choice of sensor design parameters. The sensor pixel pitch is an important factor as a larger pitch reduces the fraction of the pixel area that is close to the boundary with another pixel. Further, the depth of the active sensor layer reduces the extent of charge sharing, with thinner layers allowing the charge cloud to drift a shorter distance before collection in the pixel electrodes. The shorter drifting time results in reduced lateral diffusion of the charge cloud, limiting the possibility of the cloud crossing the boundary between neighbouring pixels.

The lateral radius of the charge cloud scales linearly with its depth as it drifts through across the sensor layer, which allows the lateral size of the charge cloud to be estimated as a function of sensor layer thickness. This can be related to the pixel pitch in order to calculate the effect of charge sharing on SPNR. Simulations of SPNR in an EBSD experiment (Si specimen, 20 keV beam energy) suggest that a pixelated sensor designed with a ratio of (active sensor layer thickness/pixel pitch) of greater than 5 experiences a significant drop in the optimal SPNR available at high TH due to charge sharing effects. A pixelated electron-counting sensor operating at high TH should therefore have a (active sensor layer thickness/pixel pitch) ratio of less than 5, in order to observe a significant improvement in SPNR from energy thresholding.

When the sensor thickness cannot be reduced further, and the pixel pitch, or dimensions of a pixel, cannot be made any larger, the effect of charge sharing can be reduced by including additional circuitry to implement a "summing node" for every pixel that sums the signals in a pixel and its immediate neighbours. All pixels have a detection threshold $TH_{det}$ and the summing node has a separate threshold equivalent to TH that is used to discriminate between background and signal electrons. A count is only allocated to the one or more pixels where the pulse exceeded $TH_{det}$ provided the summing node exceeds TH. $TH_{det}$ is set to a value low enough to detect a pulse that has been reduced due to charge sharing but high enough to reduce the chance that a pulse from a neighbouring pixel will exceed $TH_{det}$. An alternative approach is to include circuitry that compares a pulse in an individual pixel to that of all neighbouring pixels when any summing node exceeds TH. A count is allocated to a pixel if the measured pulse amplitude is greater than all its neighbours and at least one of the neighbouring summing nodes is above TH. These 'charge summing' circuits significantly reduce the impact of charge sharing on SPNR but there is an increase in effective electronic noise because the electronic noise from each contributing pixel is combined when voltages are summed at the summing node. However, our simulations of SPNR in EBSD applications show that the SPNR improvement from reduced charge sharing effects significantly outweighs the reduction that results from increased effective electronic noise.

A charge-summing algorithm may also be implemented off-chip if the information output by the sensor is sufficient for identifying and reconstructing single-particle events from the signals from a plurality of pixels (for example, if the sensor provides both the time-of-arrival and magnitude of signals captured in every pixel, such as with the Timepix3 sensor; or if the expected average count rate is <<1/pixel/frame).

In one embodiment of an off-chip charge-summing algorithm, a sensor such as Timepix3 can be configured to output the time-of-arrival and magnitude of every electron event registered by the detector. In this case, a computer algorithm can be used to identify electron events registered in a cluster of directly neighbouring pixels at substantially the same time and consider these as potential instances of charge sharing. In another embodiment, a sensor such as Timepix or Timepix3 is configured to measure the total energy deposited within each pixel during a single exposure, and the beam current or exposure time is reduced such that within a single exposure, the mean number of incident electrons per pixel in a single exposure is <<1. In this condition, there is a high probability that clusters of neighbouring pixels measuring a deposited energy within a single exposure result from a single incident electron subject to charge-sharing, rather than multiple incident electrons. In both embodiments, the energy measured in these neighbouring pixels is summed, and if the total summed energy is less than the primary electron beam energy (ie, the summed energy could feasibly have originated from a single incident electron), the cluster of neighbouring events is assumed to be a single charge sharing event. In this case, the summed energy from the electron event is assigned to the single pixel in the cluster of neighbouring pixels that contributed the largest amount of energy to the sum, and the energy measured in all other pixels resulting from that electron event is set to zero.

The processing steps applied in off-sensor charge sharing correction methods are largely identical to those performed by on-sensor 'charge-summing' circuitry, however the processing is applied by a computer program or integrated circuits separate from the readout chip rather than integrated circuits on the readout chip itself. These algorithms may be useful when acquiring EBSD patterns from a specimen susceptible to beam damage, using a sensor that does not have charge-summing circuitry. In this case, it is necessary to successfully index EBSD patterns acquired with the smallest possible electron beam dose. It is therefore to useful to acquire data with low dose and SPNR, and then to process the data after acquisition to remove charge-sharing effects and improve SPNR to a level whereby patterns can be successfully indexed.

Data Transfer Rate

An additional object of the disclosed apparatus and method is to improve the speed with which EBSD patterns can be transferred off-sensor and processed. During a single EBSD pattern acquisition, the electron count in each pixel is stored on-sensor as a unit of data with a pre-defined but typically programmable number of digital bits, B. Typical values of B used in electron-counting experiments are 8, 12, 16 or 24. The maximum number of counts that can be registered by the electron counter at each pixel during a single acquisition is $(2^B-1)$. If this value is exceeded in any pixel during a single acquisition, the number of counts registered at that pixel becomes invalid, and the acquired pattern is no longer an accurate measurement of the specimen diffraction pattern.

When the pattern acquisition is finished, the electron counter at every pixel is read to a bit-depth $B_{read}$ (typically, $B_{read}$=B) from the sensor at a fixed read-rate $R_{bit}$ of bits-per-second (bps), with the rate defined by the sensor and data-transfer electronics. The rate at which full EBSD patterns can be read from the sensor per second is therefore $R_{frame}=R_{bit}/(B_{read} \cdot N_{pix})$, where $N_{pix}$ is the total number of pixels on the sensor. $R_{frame}$ places a limit on the maximum pattern acquisition rate of an EBSD experiment, as a new pattern acquisition cannot be started until electron counters from a previously acquired pattern have been fully read off the sensor. For a given detector, $R_{bit}$ and $N_{pix}$ are fixed; as such for a faster EBSD acquisition rate it is preferable to minimise $B_{read}$.

The $B_{read}$ value required for a sensor used in EBSD experiment is dependent on the number of electron counts per pixel required in an EBSD pattern in order for that pattern to be successfully indexed. For a detector that does not discriminate between signal and background electrons, most electron counts will correspond to background electrons; this significantly increases the average number counts per pixel required for successful indexing. A detector that preferentially counts signal electrons will acquire successfully indexed patterns with far fewer electron counts per pixel. This allows a significantly smaller $B_{read}$ value to be selected for a successful EBSD experiment, enabling an improved frame read-out rate $R_{frame}$.

The number of electrons required per pixel to acquire an indexable pattern without selective detection of electrons is typically at least 50. Allowing a suitable margin for error, this requires $B_{read}$ to be greater than 6 to ensure that acquired patterns are suitable for indexing. However, for a detector that acquires patterns with a high SBR due to energy-selective counting, successfully indexed patterns have been acquired with 20 or often fewer electrons per pixel. As a result, $B_{read}$ can be set to 6 or frequently less in a successful EBSD experiment. Although a small value of $B_{read}$ is desirable for fast readout, for other purposes it may be useful to configure the detector with $B_{read}$ as high as 12 bits (for example) or more. However, not all patterns will require this number of bits for successful analysis. Therefore, it is advantageous for the number of bits read from the register, $B_{read}$, to be a configurable parameter of the detector so that $B_{read}$, (perhaps less than 8), can be read out for fast data transfer. The number of read out bits, $B_{read}$ should be less than or equal to the number bits used for storage and it is useful if $B_{read}$ is configurable to be 6 bits or less, 5 bits or less, 4 bits or less, 2 bits or less or even 1 bit or less.

Improved Atomic Number Contrast

The total number of backscattered electrons emitted from a material increases with its mean atomic number. Consequently, the total count of backscattered electrons for an EBSD image is an indicator of the mean atomic number of the material being struck by the incident electron beam. If the beam is scanned over a grid of positions on the specimen surface and the total count of backscattered electrons recorded at each position, a map can be created that shows the distribution of materials with different atomic number. This map provides additional information to supplement the crystallographic information obtained from the diffraction patterns. Furthermore, instead of summing all the counts in an EBSD image, if just the counts from a collection of pixels covering a sub-region of the whole image are summed at each beam position, the map can be made more representative of a particular contrast mechanism associated with the limited angular range of emitted electrons that is defined by the shape of the sub-region used for summing.

The energy distribution of backscattered electrons is also affected by atomic number of the specimen. The distribution for a high atomic number specimen contains a greater proportion of electrons at high energy than does the distribution for a low atomic number specimen. Therefore, if low energy backscattered electrons are excluded by energy filtering, the ratio of signals for high and low atomic number specimens is greater than the ratio of total signals obtained without energy filtering. Therefore, if EBSD patterns are measured with an energy-thresholding detector and used to generate maps of electron backscatter intensity, as just described, these maps will show greater intensity contrast between specimen areas having different atomic number when low energy electrons are excluded by thresholding.

Example Apparatus

In an example apparatus corresponding to a preferred embodiment, the detector is a direct electron detector, comprising a sensor layer bump-bonded to a pixelated array of particle-counting electronic circuits. The detector is positioned as close as possible to the specimen in a position such as to maximise the fraction of electrons backscattered from the sample in an EBSD experiment that impinge on the detector. The sensor layer is a monolithic semiconductor such as silicon, of which the surface layer facing the specimen is doped to allow electrical connection to the sensor layer, resulting in a dead surface layer. Backscattered electrons impinging on the detector pass through the dead layer to liberate a cloud of charge in the active part of the sensor layer, with the dead layer dispersing the energy of impinging electrons less than the energy-spread induced by a 1500 nm layer of inactive silicon. Preferably, the dead layer should be 100 nm or less to induce an energy-spread of less than 100 eV on a 20 keV monochromatic electron beam. The total thickness of the sensor layer may typically be 300 μm.

The pixelated array of particle-counting electronic circuits may typically comprise an array of 256×256 pixels. The particle-counting circuit at each pixel includes an amplifier for measuring the energy of received electrons. The circuit produces a count event if the measured energy of the received electron is greater than a threshold value, in order to discriminate between background and signal electrons. For efficient selection of signal electrons, the particle-counting circuits measure the energy of received electron energy with an electronic noise distribution having FWHM equivalent to less than 2 keV and preferably less than 1 keV. The number of counts registered in each pixel in each pattern acquisition is stored where the storage can be configured to provide 12-bit counters per pixel or can be configured as 4-bit counters, or to be read as 4-bit counters, in order to facilitate fast read-out of acquired patterns from the detector.

Preferred embodiments of the detector incorporate additional features to mitigate the effect of charge sharing on SPNR. In one embodiment, the pitch of the pixelated array of particle-counting electronic circuits is large enough that the fraction (sensor layer thickness)/(pixel pitch) is 5 or less. For example, if the sensor layer thickness is 300 um, the pitch is larger than 60 um, although pitches larger than 100 um are also envisaged. In another embodiment, the particle-counting circuits are supplemented by an additional summing node for each pixel, which sums the charge liberated by a single incident electron collected by a pixel and its immediate neighbours. The summing node produces a count event if the combined signal in the summing node exceeds a threshold, with the count assigned to the single pixel that measured the largest amount of charge compared to its neighbours.

The invention claimed is:

1. Apparatus for detecting Kikuchi diffraction patterns, the apparatus comprising:

an electron column adapted in use to provide an electron beam directed towards a sample, the electron beam having an energy in the range 2 keV to 50 keV, and;

an imaging detector for receiving and counting electrons from the sample due to interaction of the electron beam with the sample, the detector comprising an array of pixels and having a count rate capability of at least 2,000 electrons per second for each pixel, wherein:

the imaging detector is adapted to provide electronic energy filtering of the received electrons in order to count the received electrons which are representative of the said diffraction pattern, and the imaging detector has an inert layer on the surface where the electrons enter towards the active region of the detector, wherein the inert layer disperses the detected energy of 20 keV incident electrons with an energy spread having a full-width half maximum less than 3.2 keV, wherein the imaging detector contains circuitry to detect and correct for charge sharing between pixels that can occur for a single incident particle, wherein the circuitry is configured to:

sum the electronic signal collected in a given pixel with electronic signals collected in neighboring pixels;

apply electronic energy filtering in order to count received particles representative of the diffraction pattern, wherein the applying the electronic energy filtering comprises applying a first energy threshold to the electronic signal collected in the given pixel, and applying a second energy threshold to the summed electronic signal, wherein the second energy threshold is different to the first energy threshold, and wherein a count is generated only when both the first energy threshold and the second energy threshold are exceeded; and assign counted particles to a single pixel.

2. Apparatus according to claim 1, wherein the imaging detector comprises electronic amplifiers at each pixel that introduce an electronic noise energy equivalent having full-width half maximum less than 2 keV.

3. Apparatus according to claim 1, wherein the ratio (active layer sensor thickness)/(pixel-to-pixel spacing) is less than 5.

4. Apparatus according to claim 1, wherein the number of electrons counted per pixel during a pattern acquisition is read out as a data unit of 6 bits or less.

5. Apparatus according to claim 1, wherein the camera sensor array has configurable pixel amplifiers that allow more than one pulse length to be achieved to suit different pixel count rate and energy resolution requirements.

6. Apparatus according to claim 1, wherein the electronic energy filtering is adapted to distinguish between received particles having an energy more representative of the said diffraction pattern and received particles having an energy more representative of a background.

7. Apparatus according to claim 1, wherein the incident electron beam is incident at an angle in the range 45-90° with respect to the specimen surface plane.

8. A method for detecting Kikuchi diffraction patterns, the method comprising:

providing, using an electron column, an electron beam directed towards a sample, the electron beam having an energy in the range 2 keV to 50 keV, and;

receiving and counting, using an imaging detector, electrons from the sample due to interaction of the electron beam with the sample, the detector comprising an array of pixels and having a count rate capability of at least 2,000 electrons per second for each pixel, wherein the detector is adapted to provide electronic energy filtering of the received electrons in order to count the received electrons which are representative of the said diffraction pattern, and wherein the imaging detector has an inert layer on the surface where the electrons enter towards the active region of the detector, wherein the inert layer disperses the detected energy of 20 keV incident electrons with an energy spread having a full-width half maximum less than 3.2 keV, wherein the imaging detector contains circuitry to detect and correct for charge sharing between pixels that can occur for a single incident particle, wherein the circuitry is configured to:

sum the electronic signal collected in a given pixel with electronic signals collected in neighboring pixels;

apply electronic energy filtering in order to count received particles representative of the diffraction pattern, wherein applying the electronic energy filtering comprises applying a first energy threshold to the electronic signal collected in the given pixel, and applying a second energy threshold to the summed electronic signal, wherein the second energy threshold is different to the first energy threshold, and wherein a count is generated only when both the first energy threshold and the second energy threshold are exceeded; and assign counted particles to a single pixel.

9. Apparatus for detecting Kikuchi diffraction patterns, the apparatus comprising:

an electron column adapted in use to provide an electron beam directed towards a sample, the electron beam having an energy in the range 2 keV to 50 keV, and;

an imaging detector for receiving and counting electrons from the sample due to interaction of the electron beam with the sample, the detector comprising an array of pixels and having a count rate capability of at least 2,000 electrons per second for each pixel, wherein:

the imaging detector is adapted to provide electronic energy filtering of the received electrons in order to count the received electrons which are representative of the said diffraction pattern, and the imaging detector has an inert layer on the surface where the electrons enter towards the active region of the detector, wherein the inert layer disperses the detected energy of 20 keV incident electrons with an energy spread having a full-width half maximum less than 3.2 keV, wherein the imaging detector outputs both the time-of-arrival and magnitude of signals captured in every pixel, and a computer algorithm is configured to:

identify instances whereby a single incident particle generates coincident electronic signals in a plurality of pixels;

sum the plurality of electronic signals collected in the plurality of pixels generated by single incident particles;

apply energy filtering in order to count received particles representative of the diffraction pattern, wherein the applying the electronic energy filtering comprises applying a first energy threshold to the electronic signal collected in the given pixel, and applying a second energy threshold to the summed electronic signal, wherein the second energy threshold is different to the first energy threshold, and wherein a count is generated only when both the first energy threshold and the second energy threshold are exceeded; and assign counted particles to a single pixel.

10. Apparatus according to claim 9, wherein the imaging detector comprises electronic amplifiers at each pixel that introduce an electronic noise energy equivalent having full-width half maximum less than 2 keV.

11. Apparatus according to claim 9, wherein the ratio (active layer sensor thickness)/(pixel-to-pixel spacing) is less than 5.

12. Apparatus according to claim 9, wherein the number of electrons counted per pixel during a pattern acquisition is read out as a data unit of 6 bits or less.

13. Apparatus according to claim 9, wherein the camera sensor array has configurable pixel amplifiers that allow more than one pulse length to be achieved to suit different pixel count rate and energy resolution requirements.

14. Apparatus according to claim 9, wherein the electronic energy filtering is adapted to distinguish between received particles having an energy more representative of the said diffraction pattern and received particles having an energy more representative of a background.

15. Apparatus according to claim 9, wherein the incident electron beam is incident at an angle in the range 45-90° with respect to the specimen surface plane.

* * * * *